United States Patent [19]

Sugihara et al.

[11] Patent Number: 4,929,472
[45] Date of Patent: May 29, 1990

[54] SURFACE-COATED SIC WHISKERS, PROCESSES FOR PREPARING THE SAME, CERAMIC REINFORCED WITH THE SAME, AND PROCESS FOR PREPARING SAID REINFORCED CERAMIC

[75] Inventors: Kanji Sugihara; Motohiro Yamamoto; Tohru Kida; Minoru Fukazawa, all of Gotenba, Japan

[73] Assignee: Tokai Carbon Co., Ltd., Tokyo, Japan

[21] Appl. No.: 200,265

[22] Filed: May 31, 1988

[30] Foreign Application Priority Data

Jun. 26, 1987 [JP] Japan ............................... 62-157520
Oct. 20, 1987 [JP] Japan ............................... 62-271644

[51] Int. Cl.$^5$ ............................................... B05D 3/02
[52] U.S. Cl. ..................................... 427/215; 427/228; 501/89; 501/92
[58] Field of Search .................. 427/215, 221, 728

[56] References Cited

U.S. PATENT DOCUMENTS 3,416,944 12/1968 Pirrung et al. ............... 427/228
3,861,947 1/1975 Hamling ....................... 427/215
4,407,866 10/1983 Kitamura et al. ............. 427/221
4,786,524 11/1988 Ardavy et al. ............... 427/228

OTHER PUBLICATIONS

Am. Ceram. Soc. Bull. 64[2], 298 to 304 (1985).

"25th Yogyo Kiso Toronkai Koen Yoshishu", p. 41 (1987).

*Primary Examiner*—Mark L. Bell
*Assistant Examiner*—David M. Brunsman
*Attorney, Agent, or Firm*—Armstrong, Nikaido, Marmelstein, Kubovcik & Murray

[57] ABSTRACT

Disclosed are surface-coated SiC whiskers, proceses for preparing the same, a ceramic reinforced with the same, and a process for preparing said reinforced ceramic. The surface-coated SiC whiskers are SiC whiskers (I) having a surface coated with a thin carbonaceous layer having a thickness of 7 to 100 Å, or SiC whiskers (II) having a surface coated with an $Si_3N_4$ layer. The SiC whiskers (I) can be prepared by dispersing SiC whiskers in a homogeneous solution of a thermosetting resin in an organic solvent, separating the whiskers by filtration and drying it, curing the thermosetting resin, and firing the cured thermosetting resin in a non-oxidizing atmoshpere at 800° to 1,600° C. The SiC whiskers (II) can be prepared by dispersing SiC whiskers in a solution of an organosilicon polymer in an organic solvent, separating the whiskers by filtration and drying it, heating the whiskers coated with the organosilicon polymer in a nitriding atmoshpere at 1,200° to 1,600° C. A ceramic reinforced with the SiC whiskers (I) or (II) is obtained by mixing a ceramic powder with the SiC whiskers (I) or (II) and sintering the mixed powder in an inert atmosphere or in vacuo.

6 Claims, No Drawings

SURFACE-COATED SIC WHISKERS, PROCESSES FOR PREPARING THE SAME, CERAMIC REINFORCED WITH THE SAME, AND PROCESS FOR PREPARING SAID REINFORCED CERAMIC

BACKGROUND OF THE INVENTION

The present invention relates to surface-coated SiC whiskers, processes for preparing the same, a ceramic reinforced with the same, and a process for preparing said reinforced ceramic.

More specifically, the present invention relates to SiC whiskers having a surface coated with a thin carbonaceous layer or an $Si_3N_4$ layer, a process for preparing the same, a ceramic reinforced with the same, and a process for preparing said reinforced ceramic.

Ceramics are excellent in thermal resistance, high-temperature strength, and chemical stability, and are used as various structural members including an engine part, which are used at high temperatures.

In general, ceramic materials are so unsatisfactory in fracture toughness that concentration of stress is liable to occur by a minute crack or an internal defect, leading to fracture. Therefore, a method of improving the fracture toughness has recently been widely investigated and various attempts to reinforce a ceramic with SiC whiskers to improve the toughness of the ceramic have been proposed [see, for example, Am. Ceram. Soc. Bull., 64[2], 298 to 304 (1985)]. In these attempts, the fracture toughness of a ceramic is improved by dispersing highly elastic whiskers in the ceramic according so as to terminate or control the growth of a crack in the ceramic, to deviate the direction of progress of a crack to thereby relax concentration of stress, or to absorb crack developing energy with a whisker present at the tip of a crack based on the pull-out of the whisker, or prevention of crack development with the whisker. However, when SiC whiskers are simply directly dispersed in a ceramic, the state of the interfacial bond between the SiC whiskers and the ceramic gravely influences the improvement in the fracture toughness of the ceramic. When the interfacial bond is strong, the effect of improving the fracture toughness is insufficiently exhibited. On the other hand, when the interfacial bond is weak, the SiC whiskers disadvantageously provide starting points of occurrence of cracks.

In view of the above, there have been proposed methods in which the surfaces of SiC whiskers are coated with other material in order to control the interfacial bond between the SiC whiskers and a ceramic and the surface-coated SiC whiskers are dispersed in the ceramic.

For example, there is known a method of preparing a composite in which the surfaces of SiC whiskers are coated with carbon by the chemical vaper deposition method and the obtained carbon-coated SiC whiskers are dispersed in $Al_2O_3$ [see 25th Yogyo Kiso Toronkai Koen Yoshishu, p. 41 (1987)]. In this method, however, only SiC whiskers having a carbon coating layer having a thickness which is large (about 450 Å) and is not uniform are obtained so that the strength and fracture toughness of the ceramic are rather lowered.

As described above, although the improvement in the fracture toughness of a ceramic which serves as a high-temperature anti-corrosive structural member is a very important problem, no effective improving means have been found.

SUMMARY OF THE INVENTION

A first object of the present invention is to provide SiC whiskers having a surface coated with a thin carbonaceous layer or an $Si_3N_4$ layer.

A second object of the present invention is to provide a process for preparing SiC whiskers having a surface coated with a thin carbonaceous layer or an $Si_3N_4$ layer.

A third object of the present invention is to provide a ceramic reinforced with SiC whiskers having a surface coated with a thin carbonaceous layer or an $Si_3N_4$ layer.

A fourth object of the present invention is to provide a process for preparing a ceramic reinforced with SiC whiskers having a surface coated with a thin carbonaceous layer or an $Si_3N_4$ layer.

The first object of the present invention can be attained by surface-coated SiC whiskers consisting of SiC whiskers and thin carbonaceous layers formed on the surfaces of the SiC whiskers and having a thickness of 7 to 100 Å, or surface-coated SiC whiskers consisting of SiC whiskers and $Si_3N_4$ layers formed on the surfaces of the SiC whiskers.

The second object of the present invention can be attained by dissolving a thermosetting resin in an organic solvent to prepare a perfect solution, dispersing SiC whiskers in the obtained solution, separating the SiC whiskers by filtration and drying it to remove the above-mentioned organic solvent, heating the whiskers coated with the thermosetting resin to cure the thermosetting resin, firing the whiskers coated with the cured thermosetting resin in a non-oxidizing atmosphere at 800 to 1,600° C. to carbonize the cured thermosetting resin for forming thin carbonaceous layers on the surfaces of the above-mentioned SiC whiskers.

Alternatively, the second object of the present invention can be attained by dispersing SiC whiskers in a solution of an organosilicon polymer in an organic solvent, separating the SiC whiskers by filtration and drying it, heating the whiskers coated with the organosilicon polymer in a nitriding atmosphere at 1,200 to 1,600° C. to form $Si_3N_4$ layers on the surfaces of the above-mentioned SiC whiskers.

The third object of the present invention can be attained by an SiC whisker-reinforced ceramic consisting of a ceramic and SiC whiskers dispersed in the ceramic and having a surface coated with a thin carbonaceous layer having a thickness of 7 to 100 Å, or an SiC whisker-reinforced ceramic consisting of a ceramic and SiC whiskers dispersed in the ceramic and having a surface coated with an $Si_3N_4$ layer.

The fourth object of the present invention can be attained by mixing a ceramic powder with SiC whiskers having a surface coated with a thin carbonaceous layer having a thickness of 7 to 100 Å or an $Si_3N_4$ layer having a thickness of 15 to 200 Å and sintering the obtained mixed powder in an inert atmosphere or in vacuo.

DESCRIPTION OF THE PREFERRED EMBODIMENTS

The surface-coated SiC whiskers of the present invention are SiC whiskers having a surface coated with a thin carbonaceous layer (hereinafter referred to as "SiC whiskers A") and SiC whiskers having a surface coated with an $Si_3N_4$ layer (hereinafter referred to as "SiC whiskers B").

In the SiC whiskers A, a thin carbonaceous layer having a thickness of 7 to 100 Å is formed on the surface of an SiC whisker. In the case of the thinnest layer, the thickness approximately corresponds to that of a monomolecular film of carbon.

The thickness of an $Si_3N_4$ layer in the SiC whiskers B is 15 to 200 Å.

The SiC whiskers as used herein are acicular single crystals having a diameter of 0.1 to 1 μm and a length of 30 to 100 μm. SiC whiskers are utilized as a reinforcing material since they have a high strength.

SiC whiskers can be prepared by mixing a carbon powder such as carbon black with an $SiO_2$ powder and heating them in an inert atmosphere at 1,200 to 1,800° C.

The SiC whiskers A are prepared by the following process. A thermosetting resin is dissolved in an organic solvent to form a solution having a concentration of 2 wt.% or lower. The obtained solution is allowed to stand for a long time, for example, for several days, to limitlessly mix molecules of the thermosetting resin with the organic solvent, whereby a perfect solution is prepared. Namely, the thermosetting resin is microscopically homogeneously mixed with the organic solvent to provide a state of one phase. If a perfect solution of the thermosetting resin and the organic solvent is not formed, the thickness of the resin coating the surfaces o SiC whiskers is unfavorably uneven.

Whether or not a perfect solution is formed can be judged by measuring the viscosity, the refractive index, the degree of freezing point depression or the like of a solution.

If the solution has a concentration of the thermosetting resin exceeding 2 wt.%, the thickness of the resin coating tends to be so great that the organic solvent is likely to undergo locally uneven evaporation to make the thickness of the resin uneven or produce pores or cavities in the resin coating. Thus, a concentration of the thermosetting resin greater than 2 wt.% is not desirable.

Although any kind of thermosetting resins can be used, phenolic and furan resins providing a high rate of carbonization are preferably used. Ethanol, acetone, benzene, toluene, and the like are preferably used as the solvent.

SiC whiskers are dispersed in the solution of the thermosetting resin in an organic solvent prepared in the above-mentioned manner at a concentration of 50 to 200 g/l. When the SiC whisker concentration is lower than 50 g/l, the productivity is lowered, leading to a rise of the cost. When it exceeds 200 g/l, a difficulty is encountered in dispersing the SiC whiskers in the resin solution.

The SiC whiskers are separated by filtration and dried to remove the organic solvent, whereby SiC whiskers coated with the thermosetting resin are obtained.

Subsequently, these SiC whiskers coated with the thermosetting resin are heated to obtain SiC whiskers coated with a cured thermosetting resin. Although the heating temperature varies depending on the kind of thermosetting resin used, it is ordinarily 150 to 250° C.

The obtained SiC whiskers coated with the cured thermosetting resin are fired in a non-oxidizing atmosphere at 800 to 1,600° C. to carbonize the cured thermosetting resin, whereby the SiC whiskers A of the present invention are obtained.

The separation of the SiC whiskers by filtration from the solution of the thermosetting resin in an organic solvent is preferably conducted as slowly as possible in order to make uniform the amount of the thermosetting resin solution adhering to each of the surfaces of the SiC whiskers. Further, heat cure of the thermosetting resin as well as firing and carbonization of the cured thermosetting resin are preferably conducted as slowly as possible in order to suppress foaming and deformation of the resin layer to thereby uniformly carbonize the resin layer.

The SiC whiskers B of the present invention are prepared as follows. An organosilicon polymer such as polycarbosilane or a silicone resin is dissolved in an organic solvent such as benzene, toluene, xylene, ether, or alcohol. SiC whiskers are homogeneously dispersed in the resulting solution. Although the concentration of the organosilicon polymer varies depending on the kind of organosilicon polymer to be used, the kind of organic solvent to be used, the thickness of an $Si_3N_4$ layer to be formed, and the like, it is generally 0.1 to 6 wt.%. Although the concentration of the SiC whiskers dispersed in the solution of the organosilicon polymer in an organic solvent also varies depending on the concentration of the organosilicon polymer, the thickness of an $Si_3N_4$ layer to be formed, and the like, it is usually 50 to 200 g/l.

Subsequently, the SiC whiskers are separated by filtration and dried to remove the organic solvent, whereby organosilicon polymer are formed on the surfaces of the SiC whiskers.

Since the obtained SiC whiskers coated with the organosilicon polymer are combined together because the organosilicon polymer acts as a binder, the SiC whiskers coated with the organosilicon polymer must be separated from each other.

Subsequently, these SiC whiskers coated with the organosilicon polymer are heated in a nitriding atmosphere such as a stream of $N_2$ at 1,200 to 1,600° C. to obtain SiC whiskers B of the present invention coated with $Si_3N_4$ formed by a reaction of the organosilicon polymer with $N_2$.

The thickness of the $Si_3N_4$ layer is 15 to 200 Å as described hereinbefore, and can be adjusted by suitably setting the concentration of the organosilicon polymer and the concentration of the SiC whiskers dispersed in the solution of the organosilicon polymer in an organic solvent. For example, the thickness of the $Si_3N_4$ layer can be adjusted to 15 to 200 Å by setting the concentration of polycarbosilane in an organic solvent at 0.4 to 6 wt.% and the concentration of the dispersed SiC whiskers at 50 t 200 g/l.

A ceramic reinforced with SiC whiskers A is prepared in the following manner. SiC whiskers A are homogeneously mixed with a ceramic powder and preferably a sintering aids to prepare a mixed powder. In this case, the above-mentioned components are preferably dispersed in solvent like a water to effect mixing, separated by filtration, and dried, whereby a more homogeneously mixed powder can be obtained.

With a view to obtaining a satisfactory fracture toughness, the compounding amount of the SiC whisker A and a SiC whisker B later to be described should preferably be 10 to 30% based on the weight of the ceramic powder.

Subsequently, the mixed powder is sintered in an inert atmosphere or in vacuo by, for example, hot pressing, whereby a ceramic reinforced with SiC whiskers A can be obtained.

A powder of a carbide, nitride, or oxide ceramic such as SiC, TiC, $Si_3N_4$, or $Al_2O_3$ is used as a ceramic material which serves as a matrix material. The particle size of the ceramic powder is usually 0.01 to 2 μm. Examples of the sintering aids which is preferably used include $Y_2O_3$, MgO, $CeO_2$, $Al_2O_3$, $B_2O_3$, C, and CaO. The sintering temperature is 1,400 to 2,100° C.

A ceramic reinforced with SiC whiskers B can be prepared in the same manner as that of the preparation of the ceramic reinforced with the SiC whiskers A. Examples of ceramic materials which can be used include various oxide, nitride, and carbide ceramic materials such as $Al_2O_3$, $ZrO_2$, $Si_3N_4$, TiN, SiC, and TiC. A sintering aids as mentioned above may be used.

The SiC whiskers A of the present invention have a surface coated with a thin carbonaceous layer substantially corresponding to a monomolecular film as described hereinbefore. The interfacial bond between the SiC whiskers and a ceramic powder can be suitably adjusted with the thin carbonaceous layer. Therefore, the fracture toughness and strength of a ceramic can be enhanced by the pull-out of the SiC whiskers A.

On the other hand, in the SiC whiskers B, $Si_3N_4$ layers formed on the surfaces of SiC whiskers are very stable. In the case of the SiC whiskers A, when they are sintered with an oxide ceramic powder, they sometimes react with the oxide ceramic powder to oxidize part of the thin carbonaceous layers of the SiC whiskers A.

Further, a CO gas is liable to be generated according to the following reaction to form pores:

$$SiO_2 + 3C + SiC + 2CO$$

Also, the thin carbonaceous layers of the SiC whiskers A sometimes react with a nitride ceramic material to form tough layers of a carbide of a matrix component on the surfaces of the SiC whiskers. Therefore, in the case of the SiC whiskers A, the interfacial bond between the SiC whiskers and the ceramic powder becomes strong in some cases so that increases in the fracture toughness and strength of the ceramic by the pullout of the SiC whiskers A cannot be attained.

Further, the cushioning effect of relieving an impact at the intersurface is lowered in some cases.

In contrast, since the SiC whiskers B have a very stable $Si_3N_4$ layer, the SiC whiskers B do not react with a ceramic powder as a matrix in preparation of a ceramic reinforced with the SiC whiskers B by sintering the SiC whiskers B together with the ceramic powder. Thus, the intersurface bond between the SiC whiskers and the ceramic powder can be suitably adjusted. Therefore, in the case of a composite of SiC whiskers and a matrix with which the SiC whiskers A inevitably react, the SiC whiskers B can improve the fracture toughness and strength of a ceramic by virtue of the pullout thereof as compared with the SiC whiskers A.

Examples of the present invention will now be described.

EXAMPLE 1:

Preparation of SiC whiskers A 14.4 g of a phenolic resin (Resitop PGA-4508 manufactured by Gun-Ei Chemical Industry Co., Ltd.) was dissolved in 4,780 ml of ethanol (concentration: 0.3 wt.%). Thereafter, the resulting solution was allowed to stand for 7 days to prepare a perfect solution in which the polymer chanis of the phenolic resin were homogeneously dispersed in ethanol.

480 g of SiC whiskers (diameter: 0.1 to 1 μm, length: 30 to 100 μm) were mixed with the perfect solution by stirring to disperse the whiskers in the solution. Thereafter, the SiC whiskers were separated by filtration and air-dried to remove the ethanol by evaporation. The amount of the phenolic resin adhering to the SiC whiskers was 2.4 g.

Subsequently, the whiskers coated with the phenolic resin were heated at 170° C. for 2 hours to cure the phenolic resin and then fired in an atmosphere of argon in a high-frequency furnace at 1,000° C. for 4 hours to carbonize the cured phenolic resin.

The surfaces of the obtained SiC whiskers coated with a thin carbonaceous layer were observed by a photograph taken with a transmission electron microscope (TEM). According to the observation of the photograph, the thickness of the thin carbonaceous layer was about 15 Å.

Substantially the same procedure as that described above was repeated except that a perfect solution prepared by dissolving 87 g of a phenolic resin in 4,700 ml of ethanol (concentration: 1.8 wt.%) and allowing the resulting solution to stand for 7 days was used. SiC whiskers having a surface coated with a thin carbonaceous layer were obtained. The thickness of the thin carbonaceous layer was about 90 Å.

Substantially the same procedure as that described above was repeated except that a perfect solution prepared by dissolving 192 g of a phenolic resin in 4,600 ml of ethanol (concentration: 4 wt.%) and allowing the resulting solution to stand for 7 days was used. SiC whiskers having a surface coated with a thin carbonaceous layer were obtained. The thickness of the thin carbonaceous layer was 200 Å.

EXAMPLE 2:

Preparation of ceramic reinforced with SiC whiskers A

Each of the SiC whiskers obtained in Example 1 and having a surface coated with a thin carbonaceous layer and an $Si_3N_4$ powder (particle size: 0.2 μm) were dispersed in water at a predetermined ratio, followed by filtration and drying. Thus, a homogeneously mixed powder was obtained. 10 wt.% of $Y_2O_3$ was added as a sintering assistant to the $Si_3N_4$ powder.

The mixed powder was hot-pressed in vacuo at 1,800° C. at 35 MPa to obtain a sinter having a diameter of 40 mm and a thickness of 5 mm. The fracture toughness and flexural strength of the sinter were measured. They are shown in Table 1. For comparison, a sinter was prepared using SiC whiskers not coated with a thin carbonaceous layer in the same manner as that described above. The results of measurement of the fracture toughness and flexural strength of the sinter are shown in Table 1.

As is apparent from Table 1, the fracture toughness and the flexural strength can be improved by coating the surfaces of SiC whiskers with thin carbonaceous layers, particularly those having a thickness of about 15 Å.

TABLE 1

| | Blending ratio of SiC whiskers | Thickness of thin carbonaceous layer | | | |
|---|---|---|---|---|---|
| | | 15Å | 90Å | 200Å | — |
| Fracture | 10% | 6.3 | 6.2 | 5.9 | 5.9 |
| toughness | 15% | 7.6 | 7.0 | 6.6 | 6.7 |
| (MPam$^{\frac{1}{2}}$) | 20% | 8.0 | 7.6 | 7.2 | 7.3 |
| Flexural | 10% | 640 | 630 | 600 | 610 |
| strength | 15% | 710 | 690 | 660 | 670 |
| (MPa) | 20% | 740 | 730 | 700 | 710 |

EXAMPLE 3:

Preparation of SiC whiskers B and ceramic reinforced with SiC whiskers B 135 g of polycarbosilane (Mark III manufactured by Nikkei Kako K.K.) was dissolved in 5,000 ml of benzene. 800 g of SiC whiskers (diameter: 0.1 to 1 μm, length: 30 to 100 μm) were added to the resulting solution, followed by mixing by stirring to effect homogeneous dispersion. The resulting dispersion was filtered, and the whiskers were air-dried and further dried under a vacuum of 1 Torr or less at 150° C. Thus, 831 g of SiC whiskers coated with the polycarbosilane were obtained. The SiC whiskers were separated from each other to such an extent that all the whiskers passed through a #32 sieve. Thereafter, the whiskers coated with the polycarbosilane were subjected to a nitriding treatment in a stream of $N_2$ at 1,500° C. for 30 minutes. The weight of the whiskers after the nitriding treatment was 824 g. As a result of observation of the surfaces of the whiskers with a TEM, it was found that layers were formed all over the surfaces of the SiC whiskers, and the thickness of the layers was 90 Å on the average. As a result of analysis by electron diffraction and powder X-ray diffraction, it was found that the layers were formed of microcrystalline $Si_3N_4$.

Also, SiC whiskers having respective thicknesses of the $Si_3N_4$ layer of 20 Å, 180 Å and 300 Å were obtained in same manners as above except that polycarbosilane was used in respective amounts of 30 g, 270 g and 450 g.

The SiC whiskers coated with the $SI_3N_4$ layer and an $Si_3N_4$ powder (average particle size: 0.2 μm) were dispersed in water at a predetermined ratio, followed by filtration and drying. Thus, a homogeneously mixed powder was obtained. 10 wt.% of $Y_2O_3$ was added as a sintering aids to the $Si_3N_4$ powder. The mixed powder was hot-pressed in vacuo at 1,800° C. at 35 MPa to obtain a ceramic sinter having a diameter of 40 mm and a thickness of 5 mm.

The fracture toughness and flexural strength of the ceramic sinter were measured. They are shown in Table 2. For comparison, a ceramic sinter was prepared using SiC whiskers not coated with an $Si_3N_4$ layer in the same manner as that of Example 3. The results of measurement of the fracture toughness and flexural strength of the sinter are shown in Table 2.

TABLE 2

| | Blending ratio of SiC whiskers | Thickness of $Si_3N_4$ layer | | | | | Carbonaceous layer (90Å) |
|---|---|---|---|---|---|---|---|
| | | 20Å | 90Å | 180Å | 300Å | — | |
| Fracture toughness (MPam$^{\frac{1}{2}}$) | 10% | 6.5 | 6.5 | 6.5 | 5.9 | 5.9 | 6.2 |
| | 15% | 7.9 | 7.8 | 7.5 | 6.5 | 6.7 | 7.0 |
| | 20% | 8.1 | 8.1 | 8.0 | 7.1 | 7.3 | 7.6 |
| Flexural strength (MPa) | 10% | 630 | 630 | 620 | 600 | 610 | 630 |
| | 15% | 720 | 730 | 720 | 660 | 670 | 690 |
| | 20% | 760 | 750 | 740 | 690 | 710 | 730 |

We claim:

1. A process for preparing surface-coated SiC whiskers comprising the steps of dissolving a thermosetting resin in an organic solvent to prepare a perfect solution, dispersing SiC whiskers in said perfect solution, separating the SiC whiskers by filtration and drying it to remove said organic solvent, heating the whiskers coated with said thermosetting resin to cure said thermosetting resin, firing the whiskers coated with the cured thermosetting resin in a non-oxidizing atmosphere at 800 to 1,600° C. to carbonize said cured thermosetting resin to thereby form thin carbonaceous layers on the surfaces of said SiC whiskers.

2. A process for preparing surface-coated SiC whiskers as claimed in claim 1, wherein the concentration of said thermosetting resin in the solution in an organic solvent is 2 wt.% or lower.

3. A process for preparing surface-coated SiC whiskers as claimed in claim 1, wherein said thermo-setting resin is a member selected from the group consisting of phenolic resins and furan resins.

4. A process for preparing surface-coated SiC whiskers as claimed in claim 1, wherein said organic solvent is a member selected from the group consisting of ethanol, acetone, benzene, and toluene.

5. A process for preparing surface-coated SiC whiskers as claimed in claim 1, wherein the concentration of said SiC whiskers dispersed in the solution of said thermosetting resin in an organic solvent is 50 to 200 g/l.

6. A process for preparing surface-coated SiC whiskers as claimed in claim 1, wherein filtration of th SiC whiskers dispersed in the solution of said thermosetting resin in an organic solvent is conducted slowly, and wherein heat cure of said thermosetting resin as well as firing and carbonization of the cured thermosetting resin are conducted slowly.

* * * * *